US007920028B2

(12) United States Patent
Arai et al.

(10) Patent No.: US 7,920,028 B2
(45) Date of Patent: Apr. 5, 2011

(54) BIAS CIRCUIT AND CONTROL METHOD FOR BIAS CIRCUIT

(75) Inventors: Tomoyuki Arai, Kawasaki (JP); Masahiro Kudo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/770,841

(22) Filed: Apr. 30, 2010

(65) Prior Publication Data
US 2010/0207692 A1 Aug. 19, 2010

Related U.S. Application Data

(63) Continuation of application No. PCT/JP2007/001247, filed on Nov. 16, 2007.

(51) Int. Cl.
*H03F 3/04* (2006.01)
(52) U.S. Cl. .................................................. 330/296
(58) Field of Classification Search ............ 330/288, 330/296
See application file for complete search history.

(56) References Cited

U.S. PATENT DOCUMENTS

| | | | |
|---|---|---|---|
| 5,311,115 A | 5/1994 | Archer | |
| 5,892,402 A | 4/1999 | Tsubaki et al. | |
| 5,952,884 A | 9/1999 | Ide | |
| 6,172,567 B1 | 1/2001 | Ueno et al. | |
| 6,288,612 B1 | 9/2001 | Ueno et al. | |
| 6,384,686 B2 | 5/2002 | Ueno et al. | |
| 6,528,981 B1 | 3/2003 | Tsubaki | |
| 7,123,095 B2 | 10/2006 | Tsutsui et al. | |
| 7,639,081 B2 * | 12/2009 | Arakali et al. | 330/288 |
| 2001/0040481 A1 | 11/2001 | Ueno et al. | |
| 2005/0179498 A1 | 8/2005 | Tsutsui et al. | |
| 2007/0008037 A1 | 1/2007 | Tsutsui et al. | |

FOREIGN PATENT DOCUMENTS

| | | |
|---|---|---|
| JP | 3-48506 | 3/1991 |
| JP | 6-13820 | 1/1994 |
| JP | 6-104762 | 4/1994 |
| JP | 9-148853 | 6/1997 |
| JP | 11-234060 | 8/1999 |
| JP | 2000-151310 | 5/2000 |
| JP | 2005-229268 | 8/2005 |
| WO | 01/08299 | 2/2001 |

OTHER PUBLICATIONS

International Search Report dated Feb. 5, 2008, from the corresponding International Application.

* cited by examiner

*Primary Examiner* — Steven J Mottola
(74) *Attorney, Agent, or Firm* — Katten Muchin Rosenman LLP

(57) ABSTRACT

A bias circuit for applying a bias voltage to a nonlinear amplification circuit, including a constant-current source; and a first, second, third, and fourth transistors, wherein a current mirror circuit is configured by the first transistor and the second transistor, and the bias voltage is outputted from the drain of the second transistor, gate lengths and gate widths of the first and second transistor are the same, gate lengths of the first to fourth transistor are the same, and gate lengths and gate widths of the first, second, third, and fourth transistor are configured so that $k_4^{-0.5} - k_3^{-0.5}$ is approximately 1, where $k_3$ stands for a ratio of a gate width of the third transistor to the gate width of the first transistor and $k_4$ stands for a ratio of a gate width of the fourth transistor to the gate width of the first transistor.

8 Claims, 7 Drawing Sheets

BIAS CIRCUIT AND CONTROL METHOD FOR BIAS CIRCUIT

CROSS-REFERENCE TO RELATED APPLICATIONS

This application is a continuation of International Application No. PCT/JP2007/1247, filed on Nov. 16, 2007, now pending, herein incorporated by reference.

TECHNICAL FIELD

The present invention relates to a bias circuit and a control method for a bias circuit.

BACKGROUND ART

A bias circuit is connected to an amplifier and applies a constant bias voltage with respect to an input signal to the amplifier.

A circuit 100 illustrated in FIG. 7 includes a constant-current source (CS1) 101, first and second transistors (MN1, MN2) 102, 104, and resistor 103. Of these components, a bias circuit is configured by the constant-current source (CS1) 101 and the first transistor (MN1) and applies a bias voltage to an amplifier configured by a coil 106 and a transistor (MN3) 105.

A variety of bias circuits have heretofore been suggested (see, for example, the following Patent Document 1 to Patent Document 3).

Patent Document 1: Japanese Laid-Open Patent Publication No. H9-148853.
Patent Document 2: Japanese Laid-Open Patent Publication No. H11-234060.
Patent Document 3: International Publication Pamphlet No. WO 01/08299 A1.

In the circuit 100 illustrated in FIG. 7, the gate length of the first transistor (MN1) 102 may be made less than the gate length of the second transistor (MN2) 104 in order to apply Vth (threshold voltage) to the gate of the second transistor (MN2) 104. With such a configuration, a characteristics of the amplifier is restricted because the transistor (MN2) 104 with a large gate length is used regardless of the possibility of producing the transistor (MN1) 102 with a small gate length in the transistor production process. Further, where such the circuit 100 is produced, because the first and second transistors (MN1, MN2) 102, 104 have different gate lengths, the effect of production spread is easily demonstrated, the bias accuracy is degraded, and the yield is reduced.

In all the bias circuits described in the aforementioned patent documents, Vth+α is taken as a bias voltage with respect to the threshold voltage Vth. However, although Vth+α is applied as the bias voltage, a B-class amplifier does not operate as the B-class amplifier. This is because it starts operating as the B-class amplifier after the threshold voltage Vth has been applied. It is desirable to configure a bias circuit that will apply the threshold voltage Vth to an amplifier with nonlinear input and output, such as the B-class amplifier.

DISCLOSURE OF THE INVENTION

Problems to be Solved by the Invention

With the foregoing in view, it is an object of the present invention to provide a bias circuit and control method for a bias circuit in which fluctuations of characteristics are inhibited.

Another object of the present invention is to provide a bias circuit and control method for a bias circuit that can operate at a high speed.

Yet another object of the present invention is to provide a bias circuit and control method for a bias circuit that can apply a threshold voltage Vth to a nonlinear amplifier.

Means for Solving the Problem

According to an aspect of the invention, a bias circuit for applying a bias voltage to a nonlinear amplification circuit, including a constant-current source; and a first, second, third, and fourth transistors, wherein a current mirror circuit is configured by the first transistor and the second transistor, a drain and gate of the third transistor and a gate of the fourth transistor are connected, the first transistor and the third transistor are cascade connected, the second transistor and the fourth transistor are cascade connected, and the bias voltage is outputted from the drain of the second transistor, gate lengths and gate widths of the first and second transistor are the same, gate lengths of the first to fourth transistor are the same, and gate lengths and gate widths of the first, third, and fourth transistor are configured so that $k_4^{-0.5} - k_3^{-0.5}$ is approximately 1, where $k_3$ stands for a ratio of a gate width of the third transistor to the gate width of the first transistor and $k_4$ stands for a ratio of a gate width of the fourth transistor to the gate width of the first transistor.

And according to an aspect of the invention, a control method for a bias circuit that applies a bias voltage to a nonlinear amplification circuit, the method including detecting an output power from the nonlinear amplification circuit, and controlling ON or OFF of transistor constituting the bias circuit on the basis of the output power so that the output power becomes a set power.

Advantageous Effect of the Invention

The present invention can provide a bias circuit and control method for a bias circuit in which fluctuations of characteristics are inhibited. The present invention can also provide a bias circuit and control method for a bias circuit that can operate at a high speed. Further, the present invention can also provide a bias circuit and control method for a bias circuit that can apply a threshold voltage Vth to a nonlinear amplifier.

EXPLANATION OF REFERENCE NUMERALS

10: bias circuit.
14: constant current source.
21: first n-type transistor (MN1).
22: second n-type transistor (MN2).
24: fourth n-type transistor (MN4).
25: fifth n-type transistor (MN5).
26: sixth n-type transistor (MN5).
27: k-th n-type transistor (MNk).
50: B-class amplification circuit.
52: (k+1)-th n-type transistor (MN(k+1)).
53: third n-type transistor.
60: control unit.
62: control circuit.

BEST MODE FOR CARRYING OUT THE INVENTION

The best mode for carrying out the invention will be described below.

Figure 1:
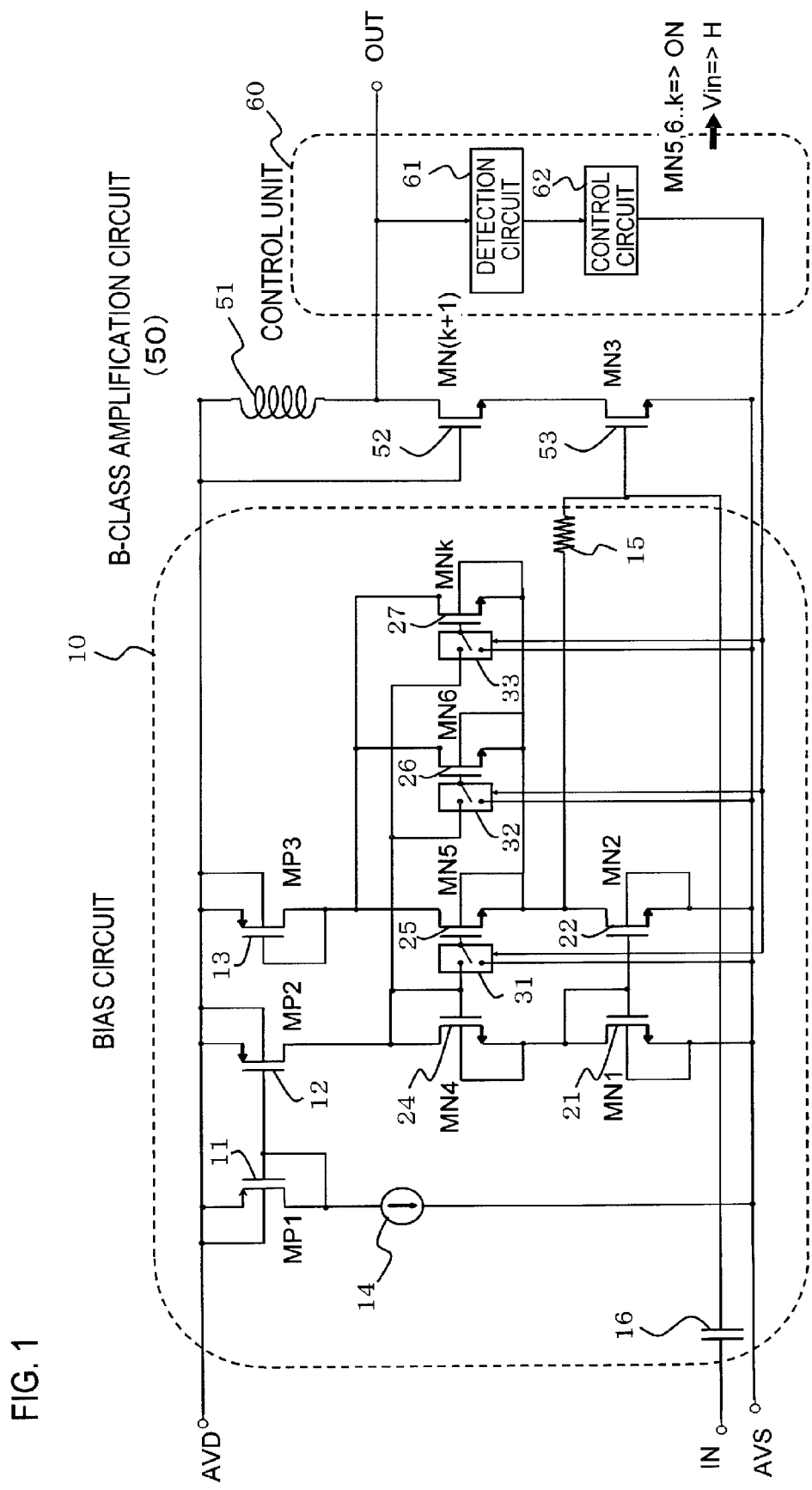
FIG. 1 illustrates configuration examples of a bias circuit, a B-class amplification circuit, and a control unit.

FIG. 1 illustrates configuration examples of a bias circuit 10, a B-class amplification circuit 50, and a control unit 60.

The bias circuit 10 includes a first to third p-channel transistors (referred to hereinbelow as p-type transistors) (MP1, MP2, MP3) 11, 12, 13, a constant-current source 14, a resistor 15, a capacitor 16, a first and second n-channel transistors (referred to hereinbelow as n-type transistors) (MN1, MN2) 21, 22, and a fourth to k-th n-type transistors (MN4, MN5, ..., MNk; k is integer equal to or greater than 7) 24, 25, 26, 27. The bias circuit 10 serves to apply a bias voltage to the B-class amplification circuit 50.

The B-class amplification circuit 50 includes a coil 51, a (k+1)-th n-type transistor (MN(k+1)) 52, and a third n-type transistor (MN3) 53. The B-class amplification circuit 50 is a nonlinear amplification circuit that amplifies only one polarity of inputted signals. An output signal of the circuit is obtained only when the input voltage is positive.

The control unit 60 includes a detection circuit 61 and a control circuit 62. The control unit 60 controls the bias circuit 10 so as to compensate a spread in the output signal outputted from the B-class amplification circuit 50.

Figure 2:
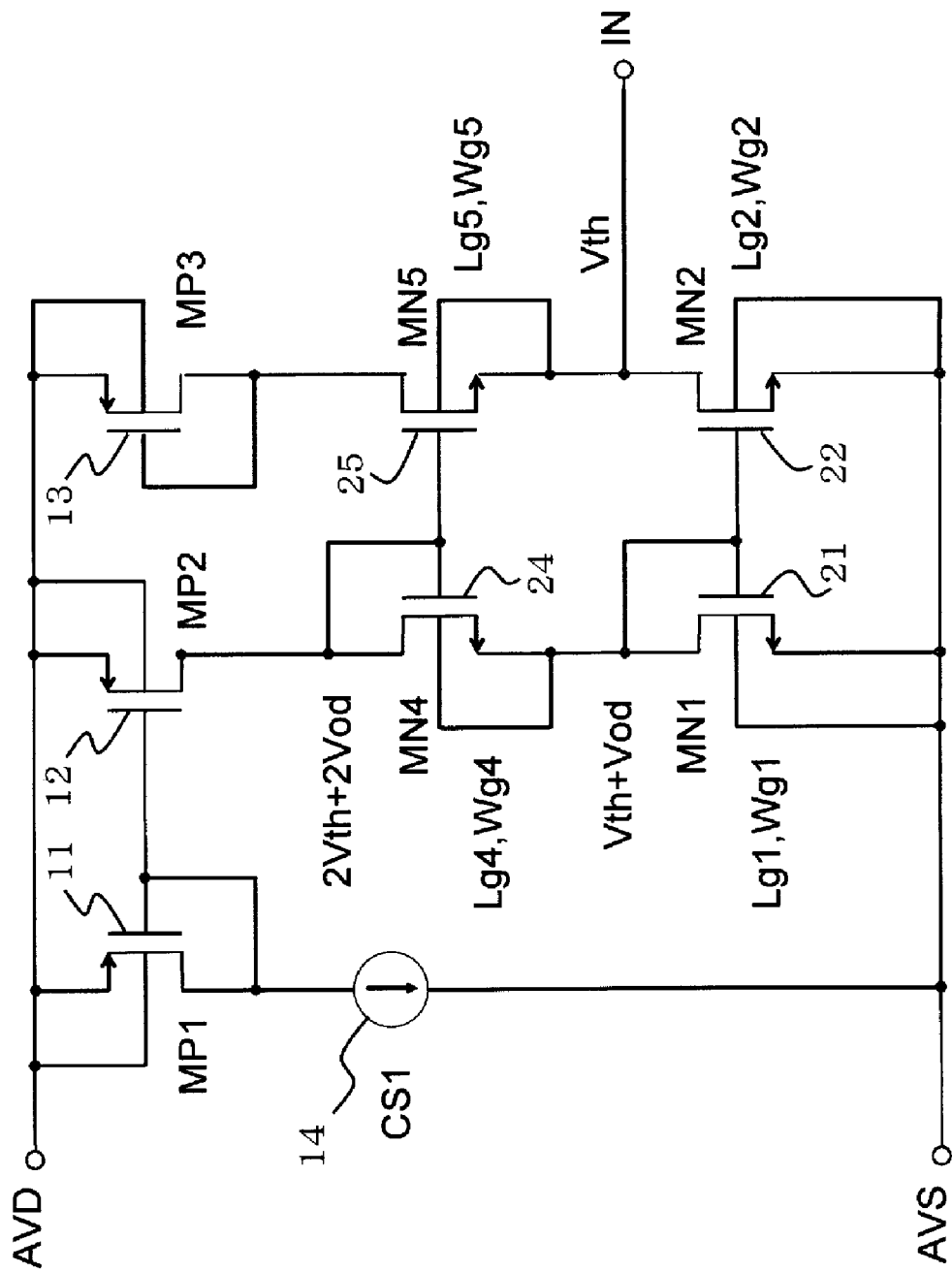
FIG. 2 illustrates a configuration example of a bias circuit.

The bias circuit 10 applies the bias voltage so as to obtain the threshold voltage Vth at the gate of the third n-type transistor 53 of the B-class amplification circuit 50. How to configure the bias circuit 10 in order to enable the output of the threshold voltage Vth will be explained in detail below. FIG. 2 illustrates a basic configuration example of the bias circuit 10 in FIG. 1. Common components are assigned with like reference numerals.

The gate of the first p-type transistor (MP1) 11 and the gate of the second p-type transistor (MP2) 12 are connected to each other, and the drain of the first p-type transistor (MP1) 11 is connected to the constant-current source 14. Further, the sources of the first to third p-type transistors (MP1, MP2, MP3) 11, 12, 13 are connected to the supply power source (AVD).

The gates of the fourth n-type transistor (MN4) 24 and the fifth n-type transistor (MN5) 25 are connected to each other to configure a current mirror circuit. A current mirror circuit is also constituted by the first n-type transistor (MN1) 21 and the second n-type transistor (MN2) 22. These two current mirror circuits are cascade connected.

The drain of the second p-type transistor (MP2) 12 and the drain of the fourth n-type transistor (MN4) 24 are connected to each other, and the drain of the fifth n-type transistor (MN5) 25 and the drain of the third p-type transistor (MP3) 13 are connected to each other. An IN terminal is connected between the drain of the second n-type transistor (MN2) 22 and the source of the fifth n-type transistor (MN5) 25, and a bias voltage is outputted from the IN terminal to the third n-type transistor (MN3) 53.

Where the gate lengths of the four n-type transistors (MN1, MN2, MN4, MN5) 21, 22, 24, 25 are denoted by Lg1, Lg2, Lg4, Lg5, respectively, the bias circuit 10 is configured so that these lengths are the same length Lg. That is, $$Lg1=Lg2=Lg4=Lg5 \quad \text{(Formula 1).}$$

Where the gate widths of the four n-type transistors 21, 22, 24, 25 are denoted by Wg1, Wg2, Wg4, Wg5, respectively, the following relationships are valid:

$$Wg1=Wg2=Wg4 \quad \text{(Formula 2).}$$

$$Wg5=(1/4)Wg2 \quad \text{(Formula 3).}$$

In other words, of four n-type transistors 21, 22, 24, 25, the first, second, and fourth n-type transistors 21, 22, 24 are configured to have the same size (same gate length and same gate width). The fifth n-type transistor 25 is so configured that the gate length thereof is equal to those of other transistors 21, 22, 24, but the gate width is approximately 1/4 that of other transistors 21, 22, 24.

The gate length of the third n-type transistor (MN3) 53 of the B-class amplification circuit 50 is equal to those of the first, second, and fourth n-type transistors 21, 22, 24.

Further, when four n-type transistors 21, 22, 24, are thus configured, the threshold voltage Vth of the third n-type transistor (MN3) 53 is outputted from the IN terminal.

A current Id flowing in a drain side of a transistor generally can be represented by following formulas:

$$Id=k(Wg/Lg)Vod^2 \quad \text{(Formula 4)}$$

Here k is represented by:

$$k=\mu Co/2 \quad \text{(Formula 5)}$$

and Vod is represented by $$Vod=Vg-Vth \quad \text{(Formula 6)}$$

Co is a gate capacity per unit surface area, μ is a mobility, and k is a constant. Vod is generally called "an overdrive voltage", and indicates the increase in gate bias Vg with respect to the threshold voltage Vth.

A drain current Id2 of the second n-type transistor 22 can be found in the following manner by using the Formula 4.

$$Id2=k(Wg2/Lg2)Vod2^2 \quad \text{(Formula 7)}$$

Vod2 indicates an overdrive voltage of the second n-type transistor 22.

On the other hand, a drain current Id5 of the fifth n-type transistor 25 can be represented by:

$$Id5=k(Wg5/Lg5)Vod5^2 \quad \text{(Formula 8).}$$

Vod5 indicates an overdrive voltage of the fifth n-type transistor 25.

Because two drain currents Id2, Id5 have the same value (Id2=Id5), the following relationship is valid:

$$k(Wg2/Lg2)Vod2^2=k(Wg5/Lg5)Vod5^2 \quad \text{(Formula 9).}$$

Where the Formula 1 and Formula 3 are substituted into the Formula 9, the Formula 9 is obtained as $$k(Wg2/Lg2)Vod2^2=k(Wg2/4Lg2)Vod5^2 \therefore Vod2=(1/2)Vod5 \quad \text{(Formula 10)}$$

On the other hand, a gate voltage Vg1 applied to the gate of the first n-type transistor 21 can be represented by the following formula on the basis of the Formula 6.

$$Vg1 = Vod1 + Vth \quad \text{(Formula 11)}$$

Because the first n-type transistor 21 and the third n-type transistor (MN3) 53 of the B-class amplification circuit 50 have the same gate length, the threshold voltage is the same Vth.

A gate voltage Vg4 of the fourth n-type transistor 24 is equal to the gate voltage of the first n-type transistor 21. Therefore, $$Vg4 = 2Vod1 + 2Vth \quad \text{(Formula 12).}$$

Where a voltage V outputted from the IN terminal is taken as VIN, a gate voltage Vg5 of the fifth n-type transistor 25 becomes $$Vg5 = Vod5 + Vth + VIN \quad \text{(Formula 13)}$$

Here, because the gate length Lg5 of the fifth n-type transistor 25 is equal to the gate length of other transistors 21, 22, 24, 25 (and also the third n-type transistor 53), the threshold voltage of the fifth n-type transistor 25 in the Formula 13 becomes the same Vth.

Here, the VG4 (the Formula 12) is equal to the gate voltage Vg5 (the Formula 13) of the fifth transistor 25. Therefore, $$VIN = (2Vod1 + 2Vth) - (Vod5 + Vth) \quad \text{(Formula 14)}$$

By substituting the Formula 10 into this the Formula 14, it is possible to obtain:

$$VIN = (2Vod1 + 2Vth) - (2Vod2 + Vth) = (2Vod1 - 2Vod2) + Vth \quad \text{(Formula 15).}$$

Here, because the gate lengths of the transistors 21, 22, 24, 25 are the same (Lg), the current flowing from the second p-type transistor (MP2) 12 to the first n-type transistor (MN1) 21 is equal to the current flowing from the third p-type transistor (MP3) 13 to the second n-type transistor (MN2) 22. In this case, the two overdrive voltages Vod1 and Vod2 satisfy the following relationship: Vod1=Vod2. Therefore, the Formula 15 becomes:

$$VIN = Vth \quad \text{(Formula 16).}$$

In other words, where gate lengths of four transistors 21, 22, 24, 25 are set in the same size and the gate width Wg5 of the fifth n-type transistor 25 is set to approximately ¼ that of other transistors, the bias circuit 10 can output from the IN terminal a bias voltage that is equal to the threshold voltage Vth of the third n-type transistor 53.

In the production of transistors, the production spread easily occurs when transistors of different gate length Lg are produced, but the production spread hardly occurs when transistors of the same gate length Lg and different gate width Wg are produced. Therefore, because four transistors 21, 22, 24, 25 of the bias circuit 10 have the same gate length Lg, the fluctuation of characteristics caused by production spread can be inhibited.

An example in which the gate width of the fifth transistor 25 is set to approximately ¼ that of other transistors will be considered below. In the bias circuit 10, the current flowing from the second p-type transistor (MP2) 12 to the first n-type transistor 21 has the same value as the current flowing from the third p-type transistor (MP3) 13 to the second n-type transistor 22. Further, the first, second, fourth, and fifth n-type transistors (MN1, MN2, MN4, MN5) 21, 22, 24, 25 have the same gate length Lg. Therefore, based on the Formula 4, the following relationship is valid:

$$Vod \propto (1/\sqrt{Wg}) \quad \text{Formula (17)}$$

The difference between the overdrive voltages Vod4 and Vod5 of the fourth and fifth transistors 24, 25 becomes as follows:

$$Vod5 - Vod4 \propto \{(1/\sqrt{Wg5}) - (1/\sqrt{Wg4})\} = (\sqrt{4} - (1/\sqrt{1})) = 1 \quad \text{(Formula 18)}$$

In other words, the Formula 18 indicates that the gate width Wg5 of the fifth transistor 25 may be configured such that the difference between the overdrive voltages Vod4 and Vod5 of the fourth and fifth transistors 24, 25 becomes equal to the overdrive voltage Vod1 of the first transistor 21.

In an example in which the aforementioned ratio ¼ is obtained, the gate width Wg4 of the fourth transistor 24 is "1" (same as the gate width Wg1 of the first transistor 21) and the gate width Wg5 of the fifth transistor 25 is "¼" (¼ of the gate width Wg1 of the first transistor 21).

Further, the gate width Wg4 is "2" (the gate width Wg of the first transistor 21 is "2" and is twice as large as the gate width Wg1 of the first transistor 21) and the gate width Wg5 of the fifth transistor 25 is "⅓" (⅓ of the gate width Wg1). This is because $(\sqrt{3} - 1/\sqrt{2}) \approx 1$ and the Formula 18 is satisfied.

In other words, the gate widths Wg1, Wg4, Wg5 of the transistors 21, 24, 25 may be provided such that the following relationship is satisfied:

$$k_4^{-0.5} - k_3^{-0.5} \approx 1 \quad \text{(Formula 19)}$$

where $k_3$ stands for a ratio of the gate width Wg4 of the fourth transistor (MN4) to the gate width Wg1 of the first transistor (MN1) 21 and $k_4$ stands for a ratio of the gate width Wg5 of the fifth transistor (MN5) to the gate width Wg1 of the second transistor (MN1) 21. In the example in which the aforementioned ratio ¼ is obtained, $k_4 = \frac{1}{4}$ and $k_3 = 1$. In the example in which the aforementioned ratio ⅓ is obtained, $k_4 = \frac{1}{3}$, $k_3 = 2$. In both case, the formula 19 is satisfied.

The bias circuit 10 illustrated in FIG. 1 is configured by arranging sixth to k-th (k is integer equal to or greater than 7) n-type transistors (MN6, . . . , Mnk) 26, 27 in parallel to the fifth n-type transistor 25. Thus, drains of the fifth to k-th n-type transistors 25, 26, 27 are connected to each other, and gates of these transistors are connected to each other, and control signals of the control unit 60 are inputted to these transistors 25, 26, 27. For example, the gate length of the sixth to k- the n-type transistors 26, 27 is equal to that of the fifth n-type transistor 25. The ratio of the gate widths of these transistors may be constituted by a ratio represented by a power of 2.

By controlling the ON, OFF switching of the fifth to k-th n-type transistors 25, 26, 27, the control unit 60 can change the gate width of the fifth n-type transistor 25 illustrated in FIG. 2. As a result, the bias voltage outputted from the bias circuit 10 can be varied in the vicinity of the threshold Vth. This will be explained below in greater detail.

Figure 3B:
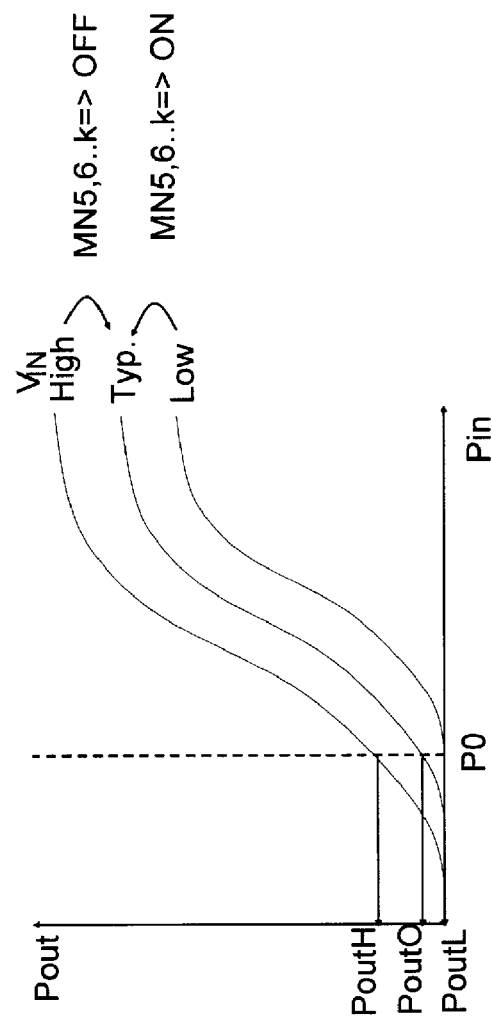
FIG. 3B illustrates an example of an input-output characteristic of the B-class amplification circuit.
Figure 3A:
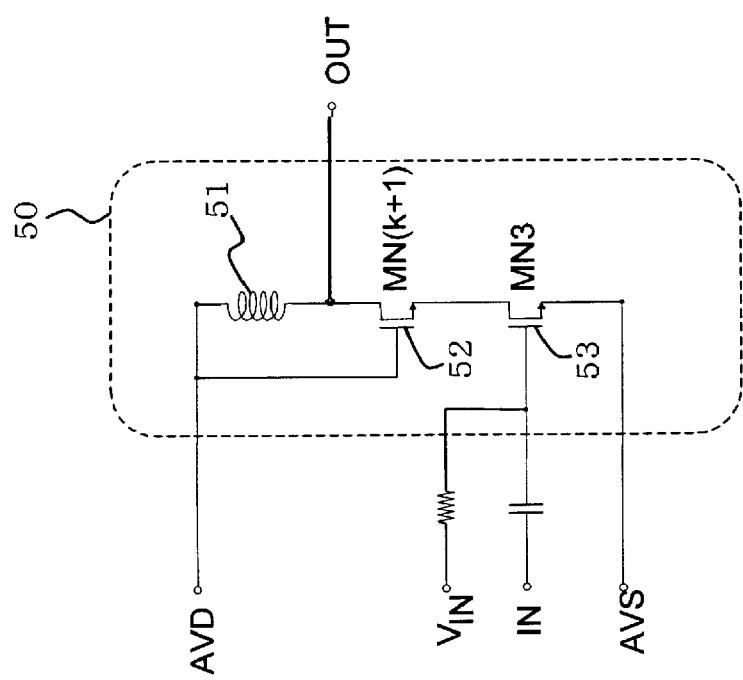
FIG. 3A illustrates a configuration example of a B-class amplification circuit.

FIG. 3A illustrates a configuration example of the B-class amplification circuit 50. FIG. 3B is a graph illustrating an example of relationship between an input power Pin and output power Pout in the B-class amplification circuit 50. In FIG. 3A, constituent components identical to those in FIG. 1 are assigned with like reference numerals.

As illustrated in FIG. 3B, in the B-class amplification circuit 50 that is set to obtain the set output power Pout0 to the input power P0, the output power Pout changes from PoutL to PoutH (PoutL<PoutH) due to the production spread.

With respect to such fluctuations, when the output power Pout is the output PoutH that is higher than the set power Pout0, the bias point provided to the B-class amplification circuit 50 is controlled so as to be low and obtain the set power Pout0 by switching OFF the fifth to k-th n-type transistors (MN5, . . . , MNk) 25, 26, 27 in FIG. 1. In contrast, when the output power Pout is the output PoutL that is lower than the set power Pout0, the bias point is controlled so as to be raise and obtain the set power Pout0 by switching ON the fifth to k-th n-type transistors (MN5, . . . , Mnk) 25, 26, 27. Such the control can inhibit the fluctuations.

Figure 4:
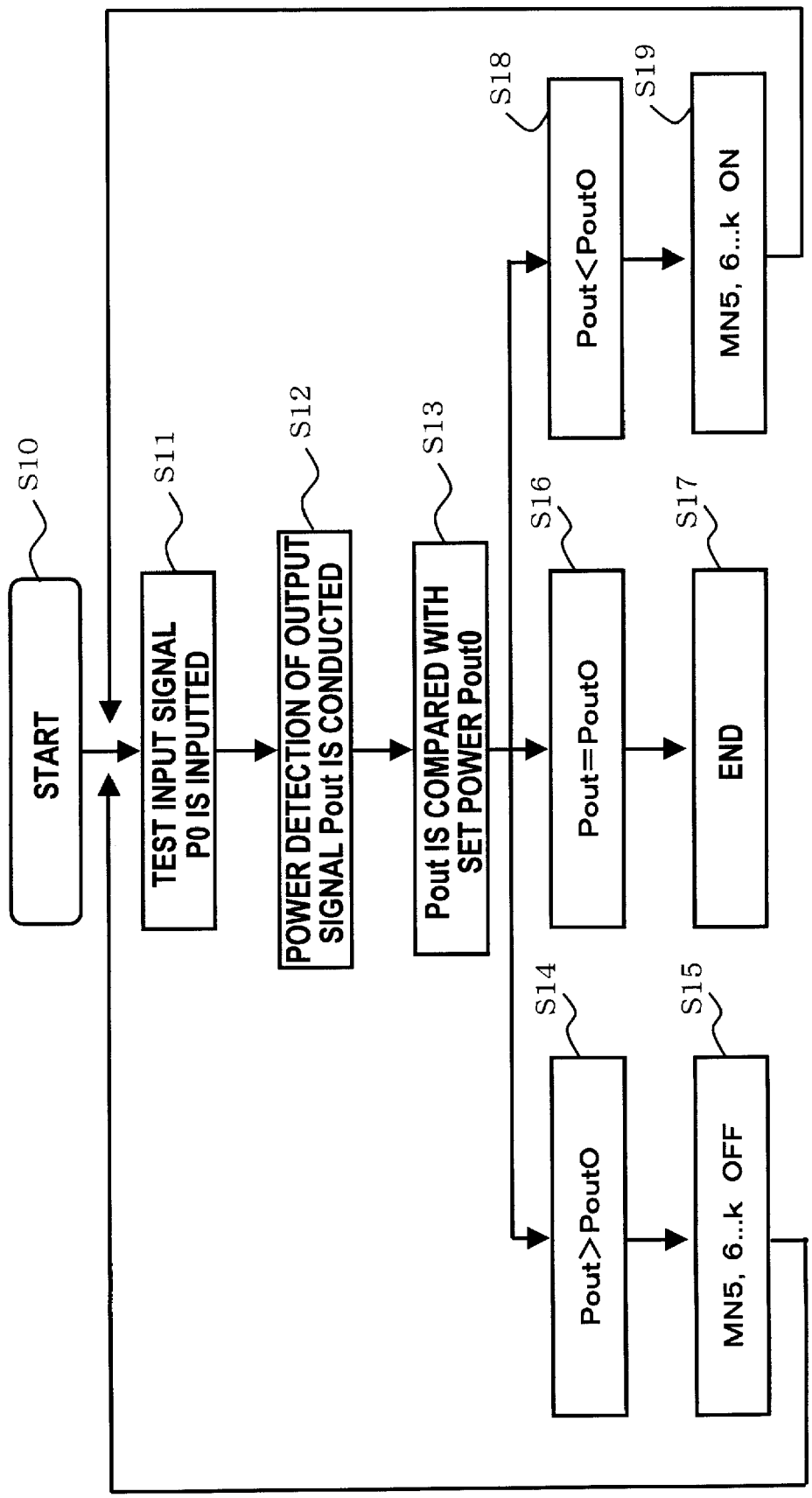
FIG. 4 illustrates the operation of the control unit.

FIG. 4 is a flowchart illustrating an example of control procedure in the control unit 60. Where the processing is started (S10), a test signal is inputted from the input terminal IN (FIG. 1 or FIG. 3A), and the detection circuit 61 of the control unit 60 detects the power Pout of the output signal (S11). The detection circuit 61 outputs the value of the detected output power Pout to the control circuit 62.

Next, the control circuit 62 compares the output power Pout with the set power Pout0 (S13), and when the output power Pout is higher than the set power Pout0 (S14), the control circuit outputs a control signal that switches OFF the fifth to k-th n-type transistors (MN5, ..., MNk) 25, 26, 27, to each of the transistors 25, 26, 27 (S15).

Further, when the output power Pout is equal to the set power Pout0 (S16), the control circuit 62 ends the processing, without outputting the control signal (S17).

Furthermore, when the output power Pout is lower than the set power Pout0 (S18), the control circuit 62 outputs a control signal that switches ON the fifth to k-th n-type transistors 25, 26, 27, to each of the transistors 25, 26, 27 (S19).

Because of the above-described control, the output power Pout that is outputted by the B-class amplification circuit 50 becomes the set power Pout0, and the fluctuations of characteristics induced by the production spread can be inhibited not only for the transistors 21 of the bias circuit 10, but also for the transistors 52, 53 constituting the B-class amplification circuit 50.

In the above-described example, the gate length and gate width of the third n-type transistor (MN3) 53 of the B-class amplification circuit 50 are equal to those of the three transistors (MN1, MN2, MN4) 21, 22, 24 of the bias circuit 10. For example, it is also possible that the ratio of the gate width Wg3 of the third transistor 53 to the gate width Wg1 of the first transistor 21 be made $$Wg3:Wg1=m:1 \quad \text{(Formula 17)}.$$

Here, m is integer equal to or greater than 2. In this case, the ratio of the current flowing in the B-class amplification circuit 50 to the current flowing to the second and third p-type transistors (MP2, MP3) 12, 13 of the bias circuit 10 also may be adjusted to become such as in the Formula 17.

Further, in order to increase accuracy, it may be necessary that the drain voltage of the second and third p-type transistors (MP2, MP3) 12, 13 be equal to that of the fourth and fifth n-type transistors (MN4, MN5) 24. For this purpose, a current mirror circuit is constituted by the first and second p-type transistors (MP1, MP2) 11, 12, the current is inputted, the gate lengths and gate widths of the second and third p-type transistors (MP2, MP3) 12, 13 are made equal, and the gate and drain of the third p-type transistor 13 are connected (FIG. 1).

Figure 5:
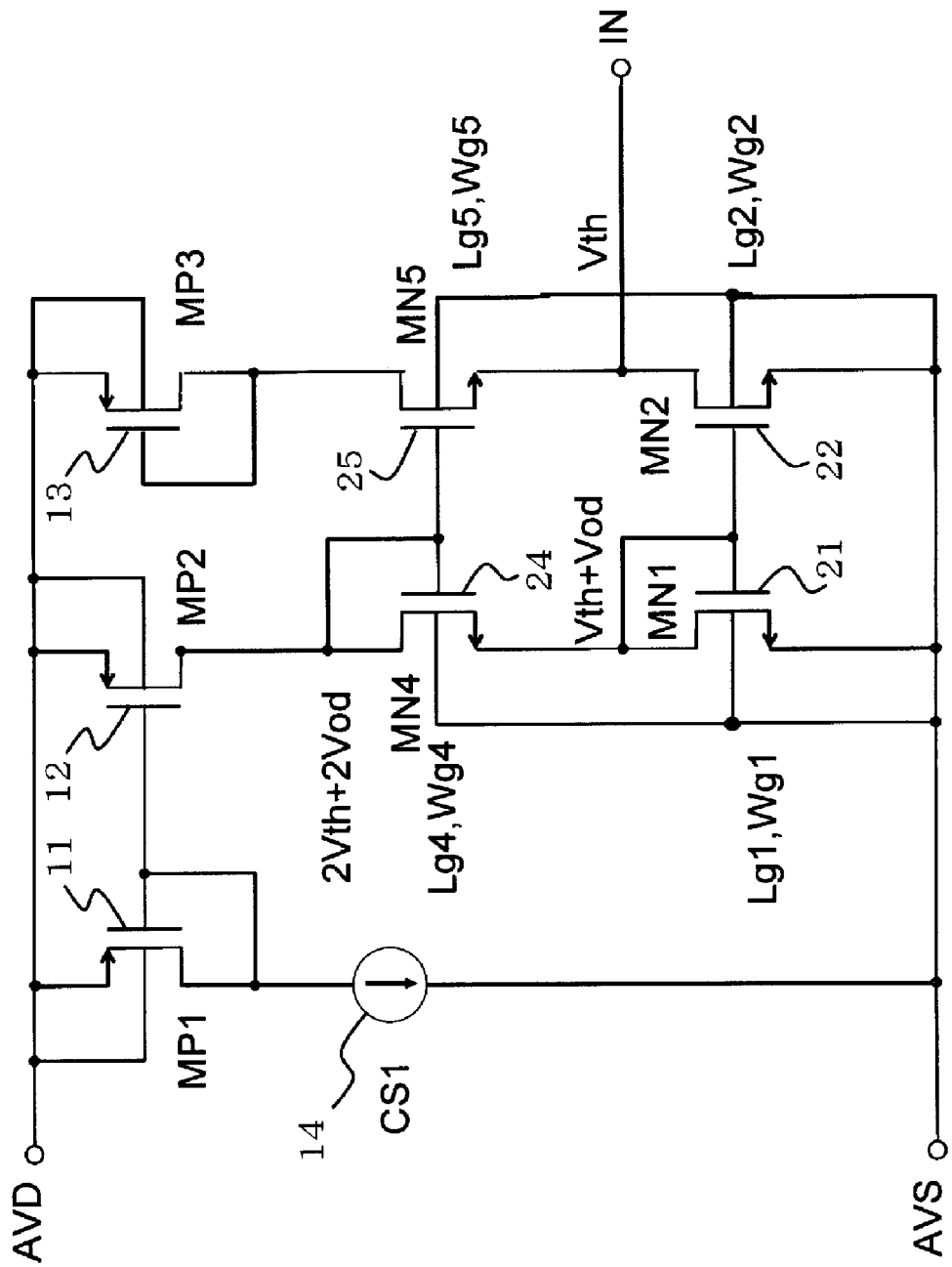
FIG. 5 illustrates another configuration example of a bias circuit.
Figure 6:
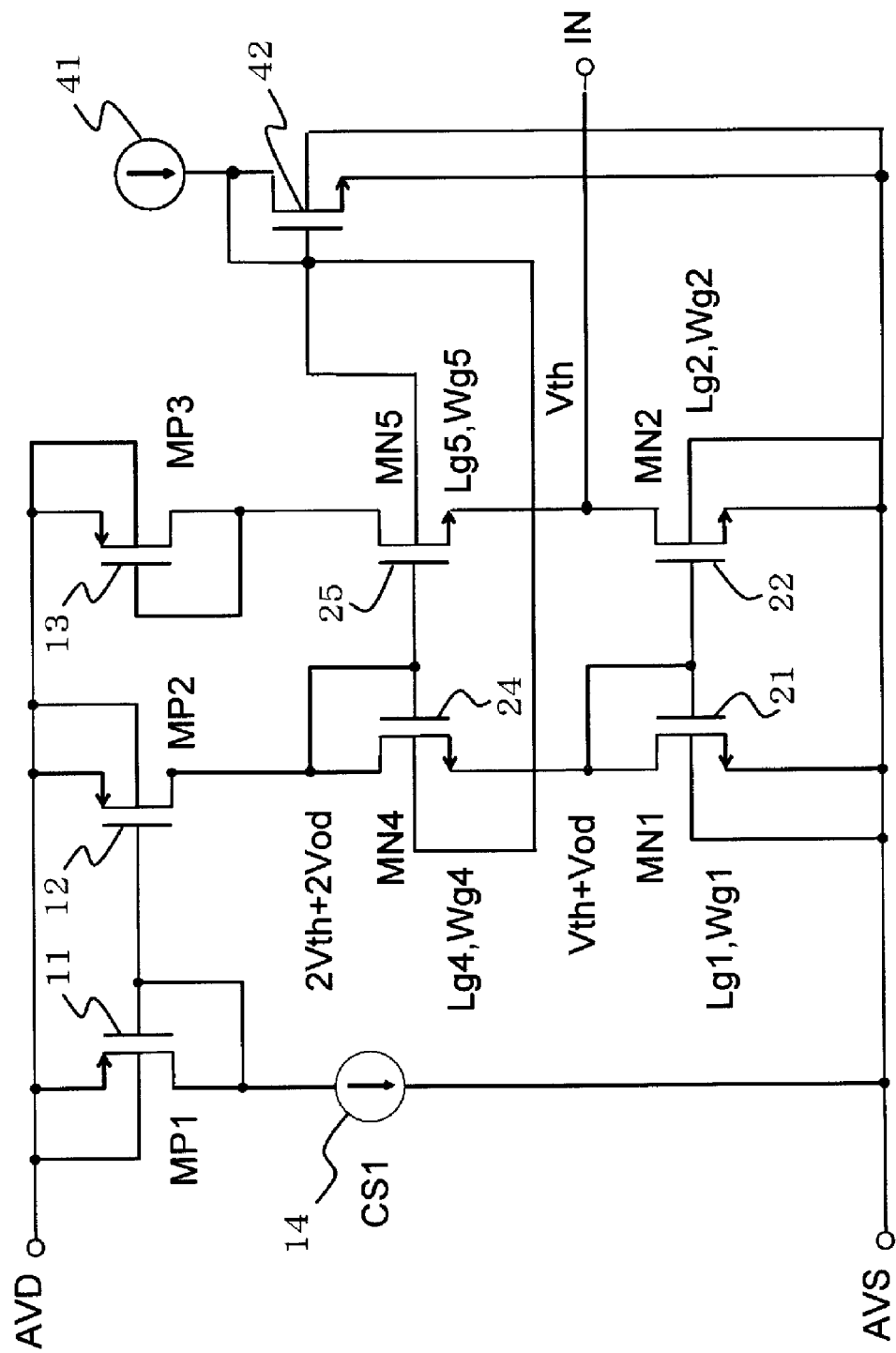
FIG. 6 illustrates another configuration example of a bias circuit.
Figure 7:
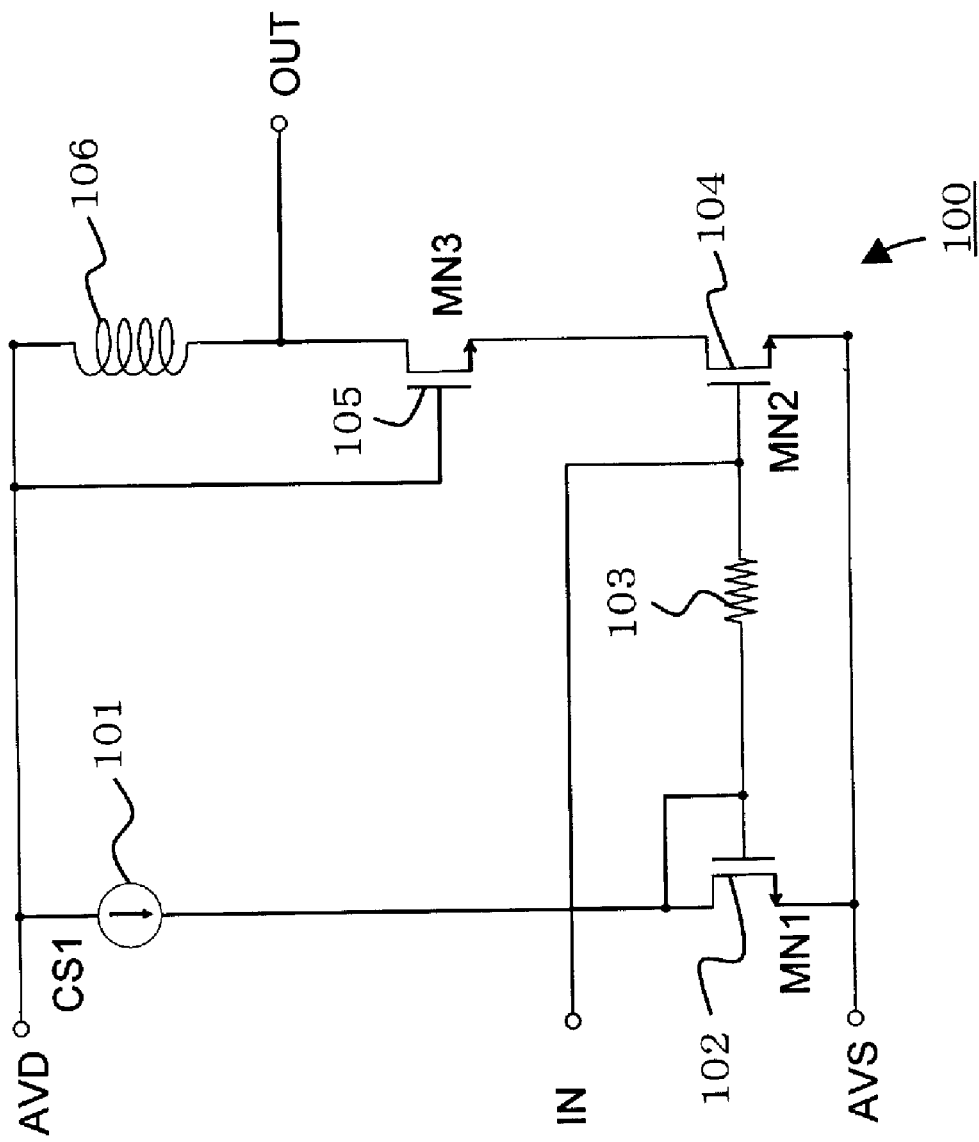
FIG. 7 illustrates a configuration example of the conventional amplifier and bias circuit.

FIG. 5 and FIG. 6 illustrate another configuration example of the bias circuit 10. FIG. 5 illustrates an example in which substrates of the fourth and fifth transistors (MN4, MN5) 24, 25 are connected to the ground, and FIG. 6 illustrates an example in which another bias circuit constituted by a constant-current source 41 and a transistor 42 directly applies a bias to the substrates of the fourth and fifth transistors (MN4, MN5) 24, 25. These bias circuits 10 can conduct control such that enables autonomous tracking of fluctuations of the threshold voltage Vth, without obtaining a control signal from the outside.

The examples above are explained with reference to the B-class amplification circuit as the amplification circuit with nonlinear input and output. In the present embodiment, the invention can be also carried out with nonlinear amplification circuits other than B-class amplification circuits, such as an AB-class amplification circuit.

Further, the bias circuit 10 and control unit 60 are explained as separate configurations, but the control unit 60 may be provided inside the bias circuit 10. In other words, the bias circuit may be constituted by the bias circuit 10 and the control unit 60.

The invention claimed is:

1. A bias circuit for applying a bias voltage to a nonlinear amplification circuit, comprising:
    a constant-current source; and
    a first, second, third, and fourth transistors, wherein
    a current mirror circuit is configured by the first transistor and the second transistor, a drain and gate of the third transistor and a gate of the fourth transistor are connected, the first transistor and the third transistor are cascade connected, the second transistor and the fourth transistor are cascade connected, and the bias voltage is outputted from the drain of the second transistor,
    gate lengths and gate widths of the first and second transistor are the same, gate lengths of the first to fourth transistor are the same, and gate lengths and gate widths of the first, second, third, and fourth transistor are configured so that $k_4^{-0.5}-k_3^{-0.5}$ is approximately 1, where $k_3$ stands for a ratio of a gate width of the third transistor to the gate width of the first transistor and $k_4$ stands for a ratio of a gate width of the fourth transistor to the gate width of the first transistor.

2. The bias circuit according to claim 1, wherein the current mirror circuit is configured by connecting the gates of the first and second transistors to each other, and the constant-current source is connected to a drain of one of the third and fourth transistors and also connected to sources of the first and second transistors.

3. The bias circuit according to claim 1, further comprising a control unit which controls ON and OFF of a plurality of fourth transistors on the basis of an output power from the nonlinear amplification circuit so that the output power becomes a set power, wherein
    the plurality of the fourth transistors are connected in parallel.

4. The bias circuit according to claim 1, wherein substrates of the third and fourth transistors are connected to a ground.

5. The bias circuit according to claim 1, further comprising a bias application circuit that directly applies a bias to the substrates of the third and fourth transistors.

6. The bias circuit according to claim 1, further comprising a fifth and a sixth transistor, wherein
    the fifth and sixth transistors have the same gate length and width, and are connected to the third and fifth transistors, respectively.

7. The bias circuit according to claim 1, wherein the first to third transistors are configured so that the gate length thereof is equal to that of the fifth transistor of a B-class amplification circuit that applies the bias voltage and a ratio of the gate width of the fifth transistor to that of the first to third transistors is 1:m (m is integer equal to or greater than 1).

8. The bias circuit according to claim 3, wherein
    the control unit controls such as to switch OFF the plurality of fourth transistors when the output power is higher than the set power, and to switch ON the plurality of fourth transistors when the output power is lower than the set power.

* * * * *